(12) United States Patent
Lin et al.

(10) Patent No.: US 11,688,610 B2
(45) Date of Patent: Jun. 27, 2023

(54) FEATURE PATTERNING USING PITCH RELAXATION AND DIRECTIONAL END-PUSHING WITH ION BOMBARDMENT

(71) Applicant: Taiwan Semiconductor Manufacturing Co., Ltd., Hsinchu (TW)

(72) Inventors: Tzung-Hua Lin, Hsinchu (TW); Yi-Ko Chen, Hsinchu (TW); Chia-Chu Liu, Hsinchu (TW); Hua-Tai Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 187 days.

(21) Appl. No.: 17/191,541

(22) Filed: Mar. 3, 2021

(65) Prior Publication Data

US 2022/0102162 A1 Mar. 31, 2022

Related U.S. Application Data

(60) Provisional application No. 63/085,545, filed on Sep. 30, 2020.

(51) Int. Cl.
*H01L 21/31* (2006.01)
*H01L 21/3115* (2006.01)
*H01J 37/317* (2006.01)

(52) U.S. Cl.
CPC .... *H01L 21/31155* (2013.01); *H01J 37/3171* (2013.01); *H01J 2237/3171* (2013.01)

(58) Field of Classification Search
CPC ............ H01L 21/31155; H01J 37/3171; H01J 2237/3171
See application file for complete search history.

(56) References Cited

U.S. PATENT DOCUMENTS

| | | | |
|---|---|---|---|
| 10,714,343 B1* | 7/2020 | Chen | H01L 21/31111 |
| 2012/0077301 A1* | 3/2012 | Ahn | H01L 27/14689 |
| | | | 438/73 |
| 2017/0213733 A1* | 7/2017 | Chou | H01L 21/0335 |
| 2017/0229560 A1 | 8/2017 | Yu et al. | |
| 2018/0182636 A1 | 6/2018 | Prasad et al. | |
| 2018/0197742 A1* | 7/2018 | Chang | H01L 21/26513 |
| 2019/0287802 A1* | 9/2019 | Chang | H01L 21/76825 |
| 2021/0296447 A1* | 9/2021 | Kyogoku | H01L 29/1095 |

* cited by examiner

*Primary Examiner* — Ali Naraghi
*Assistant Examiner* — Siangluai Mang
(74) *Attorney, Agent, or Firm* — Seed IP Law Group LLP

(57) ABSTRACT

A method for forming a semiconductor structure includes forming a pattern having first and second line features extending in a first direction on a substrate. After depositing a photoresist layer on the substrate to cover the pattern, the photoresist layer is patterned to form a cut pattern including first and second cut features exposing portions of the respective first and second line features. In a top view, at least one of the first and second cut features is asymmetrically arranged with respect to a central axis of a corresponding first or second line feature. At least one angled ion implantation is performed to enlarge the first and second cut features in at least one direction perpendicular to the first direction. The portions of the first and second line features exposed by the respective first and second cut features are then removed.

20 Claims, 14 Drawing Sheets

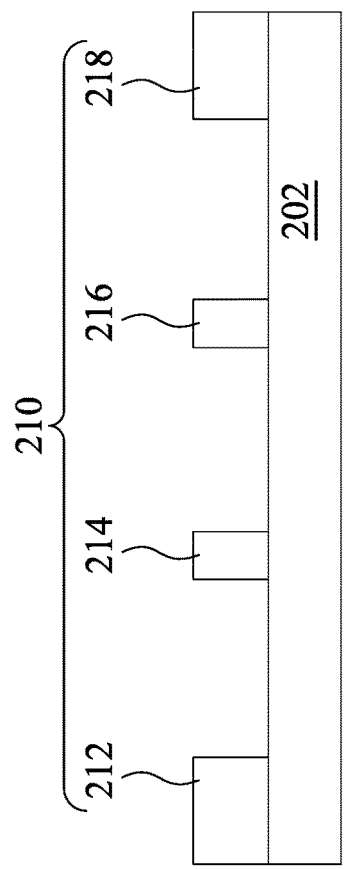
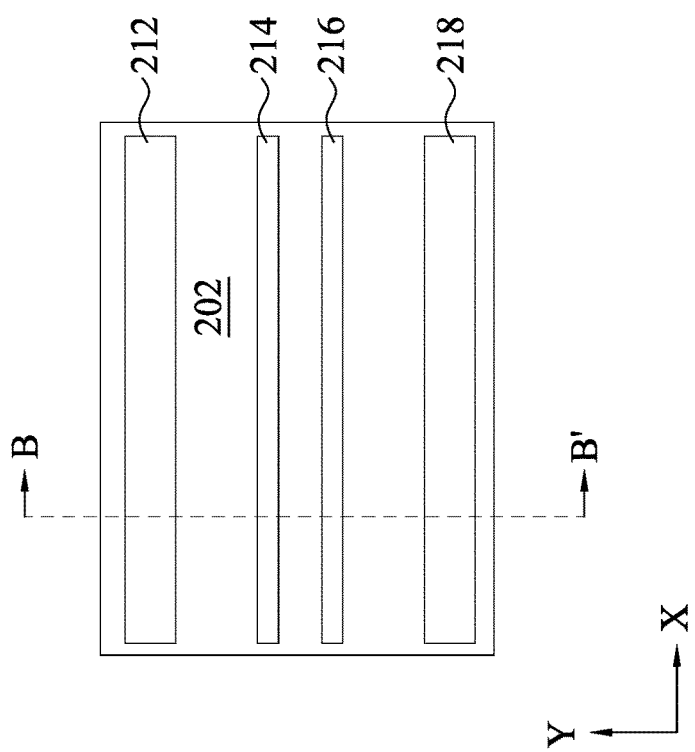
FIG. 3B
FIG. 3A

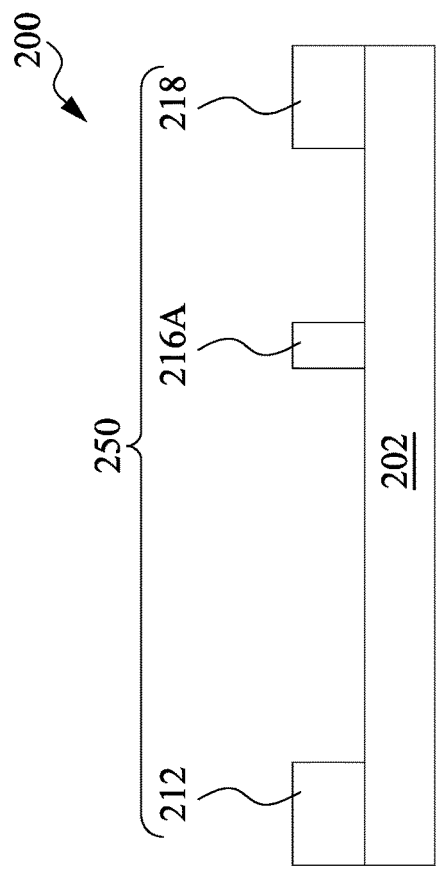
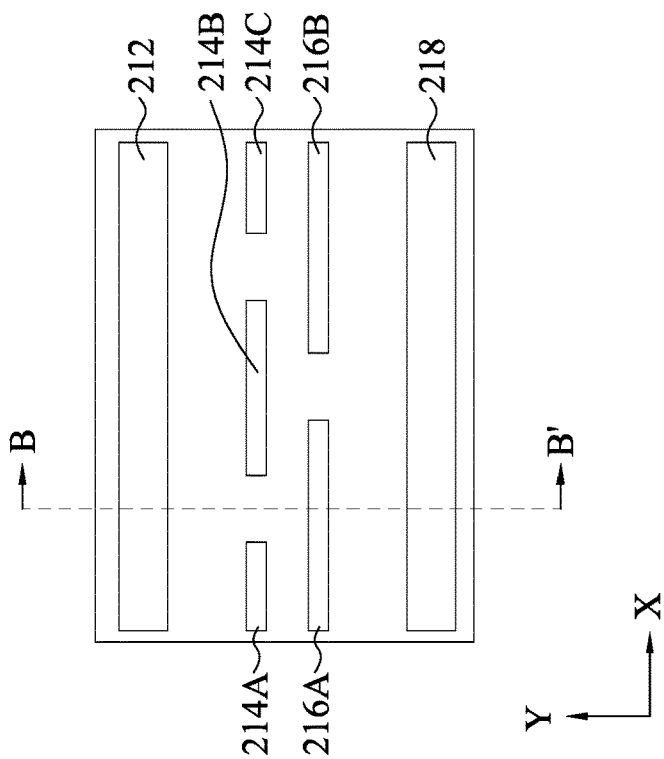
FIG. 8B
FIG. 8A

FEATURE PATTERNING USING PITCH RELAXATION AND DIRECTIONAL END-PUSHING WITH ION BOMBARDMENT

PRIORITY CLAIM AND CROSS-REFERENCE

This application claims the benefit of priority to U.S. Provisional Application No. 63/085,545, filed Sep. 30, 2020, which application is incorporated by reference herein in its entirety.

BACKGROUND

Integrated circuit (IC) technologies are constantly being improved. Such improvements frequently involve scaling down device geometries to achieve lower fabrication costs, higher device integration density, higher speeds, and better performance. Lithography is frequently used for forming components of an integrated circuit device, where generally, an exposure tool passes light through a photomask and focuses the light onto a photoresist layer over a substrate, resulting in the photoresist layer having an image of integrated circuit components therein. Forming device patterns with smaller dimensions is limited by a resolution of the exposure tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-8B are various views of the semiconductor structure at various fabrication stages constructed according to the method of FIG. 1, in accordance with some embodiments.

DETAILED DESCRIPTION

Figure 1:
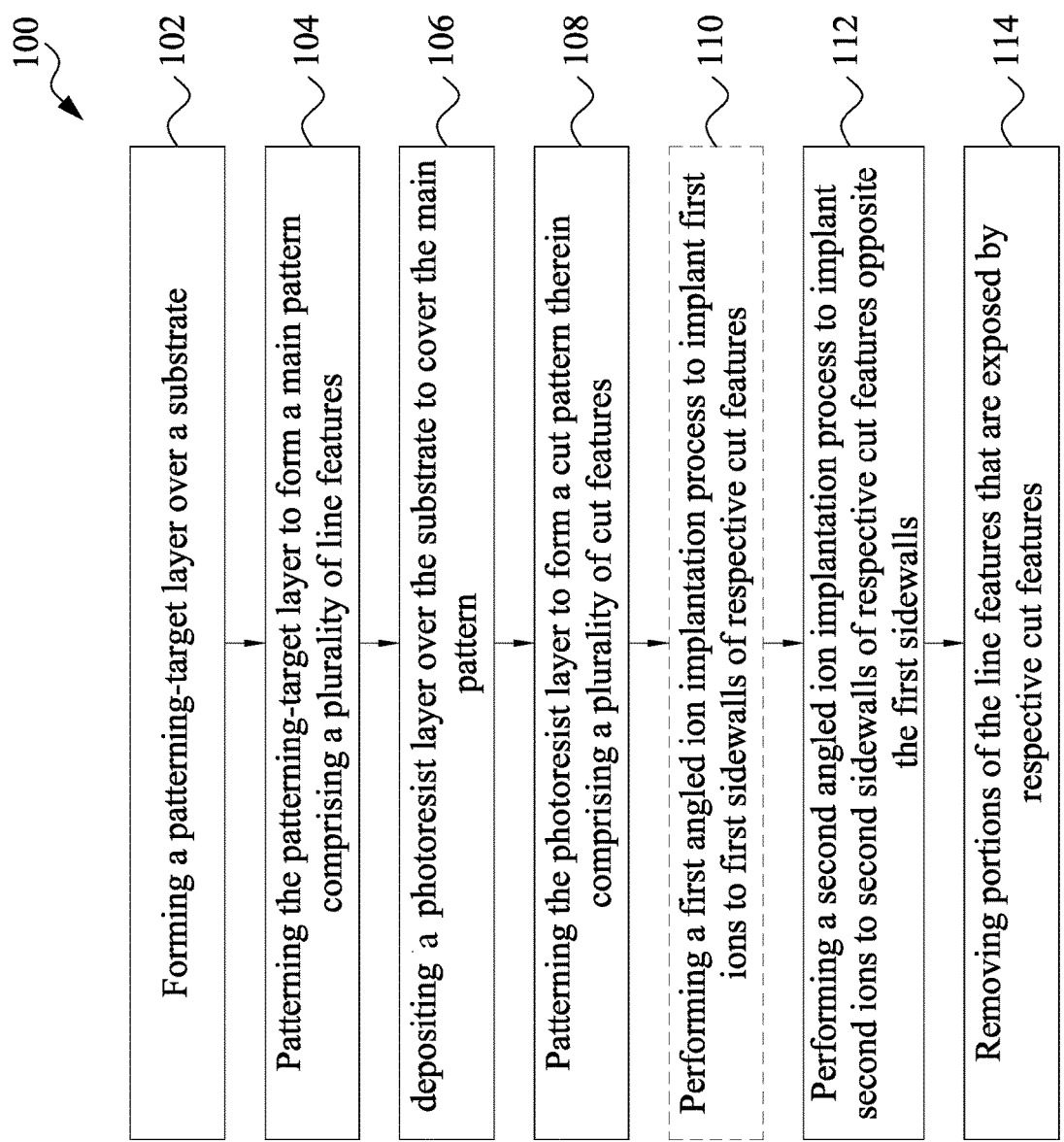
FIG. 1 is a flow chart of an example method for fabricating a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits may be formed using various photolithographic techniques. Such techniques involve exposing a photoresist layer to a light source through a photomask, thereby forming a pattern in the photoresist layer. The regions where the photoresist layer is removed expose the underlying substrate to an etching process used to transfer the pattern into the underlying substrate. As the patterns formed into the photoresist layer become increasingly dense, it becomes difficult to use a single photomask to form a pattern in the photoresist layer because features are smaller than the resolution of a light source to which the photoresist layer is exposed. Thus, multiple masks may be used to form the features within a pattern.

In some cases, a target pattern is formed through use of both a main pattern and a cut pattern. The cut pattern is used to remove features formed by the main pattern from the unwanted areas in order to achieve the desired target pattern. As the density of features in the main pattern increases, some cut features in the cut pattern may be too close to one another, thus a single photomask would not be able to form such a cut pattern when an immersion lithography system is used. In some approaches, multiple photomasks are used to form the cut pattern. Using multiple photomasks, however, increases process errors and fabrication cost. The extreme ultraviolet (EUV) lithography is known to extend the range of lithography processes to smaller feature sizes and pitches. However, EUV lithography requires very sophisticated reflecting optics or mirrors, which significantly increases fabrication cost.

In embodiments of the present disclosure, the lithography printability for cut features with small pitches is enlarged by a pitch relaxation process in which some cut features are shifted away to increase the distance therebetween, thereby allowing the cut features to be printed using a single photomask. The sizes of some cut features are then increased by ion implantation to recover the cut margin, thereby ensuring a sufficient cut window. The embodiments of the present disclosure advantageously reduce the fabrication cost and processing errors.

FIG. 1 is a flowchart of a method 100 for fabricating a semiconductor structure 200, in accordance with some embodiments. FIGS. 2A-8B are various views of the semiconductor structure 200 in various stages of the method 100, in accordance with some embodiments. The method 100 is discussed in detail below, with reference to the semiconductor structure 200, in FIGS. 2A-8B. In some embodiments, additional operations are performed before, during, and/or after the method 100, or some of the operations described are replaced and/or eliminated. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

Figure 2B:
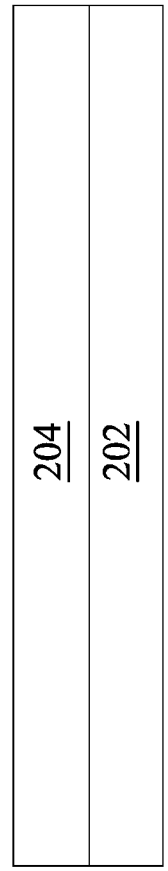
Figure 2A:
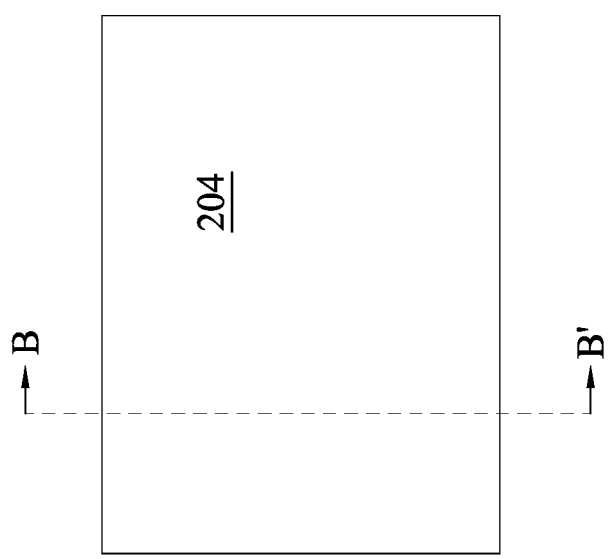

Referring to FIGS. 1 and 2A-2B, the method 100 includes operation 102, in which a patterning-target layer 204 is formed over a substrate 202. FIG. 2A is a top view of a semiconductor structure after forming the patterning-target layer 204 over the substrate 202, in accordance with some embodiments. FIG. 2B is a cross-sectional view of the semiconductor structure of FIG. 2A taken along line B-B'.

Referring to FIGS. 2A and 2B, in some embodiments, the substrate 202 is a bulk semiconductor substrate including a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the substrate 202 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate. The substrate 202 may further include additional features and/or material layers, such as various isolation features formed in the substrate. In some embodiments, the substrate 202 may include various doped regions, such as p-type doped regions and/or n-type doped regions configured and coupled to form various devices and functional features. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. The term "n-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 202, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. All doping features may be achieved using a suitable process, such as ion implantation in various steps and techniques. In some embodiments, the substrate 202 may include other features, such as shallow trench isolation (STI).

The patterning-target layer 204 is formed over the substrate 202. In some embodiments, the patterning-target layer 204 is the layer where the final patterns are formed over the substrate 202. In some embodiments, the patterning-target layer 204 has a thickness in a range from about 5 nm to about 50 nm. If the patterning-target layer 204 is too thin, it cannot be deposited as a uniform layer. If the patterning-target layer 204 is too thick, it requires a long etching time, which increases fabrication cost. In some embodiments, the patterning-target layer 204 is formed using a deposition process such as, for example, chemical vapor deposition (CVD), physical vapor deposition (PVD), atomic layer deposition (ALD), atomic layer CVD (ALCVD), or spin coating. In some embodiments, the patterning-target layer 204 is formed by converting a surface portion of the substrate 202 using a thermal oxidation or a nitridation process. In some embodiments, the patterning-target layer 204 includes one or more dielectric materials, such as silicon oxide ($SiO_2$), and/or silicon nitride ($Si_3N_4$). In some embodiments, the patterning-target layer 204 includes one or more metallic materials. In some embodiments, the patterning-target layer 204 is an upper portion of the substrate 202 and includes one or more semiconductor materials.

Referring to FIGS. 1 and 3A-3B, the method 100 proceeds to operation 104, in which the patterning-target layer 204 is patterned to form a main pattern 210. FIG. 3A is a top view of the semiconductor structure of FIGS. 2A and 2B after patterning the patterning-target layer 204 to form the main pattern 210 over the substrate 202, in accordance with some embodiments. FIG. 3B is a cross-sectional view of the semiconductor structure of FIG. 3A taken along line B-B'.

Referring to FIGS. 3A and 3B, the main pattern 210 includes a plurality of line features 212, 214, 216, 218 extending in a first direction, for example, an X direction. The line features 212, 214, 216, 218 are spaced apart from each other in a second direction, for example, a Y direction that is different from the first direction, the X direction. In some embodiments, the first direction (i.e., X direction) is a horizontal direction, and the second direction (i.e., Y direction) is a vertical direction. Although four line features 212, 214, 216, 218 are shown and described in FIG. 3A, any numbers of line features are contemplated. Further, although the line features 212, 214, 216, 218 are illustrated as rectangular-shaped lines, such is not required for some embodiments and any shapes of line features are contemplates. In some embodiments, line features 212, 214, 216, 218 are dummy features and will be removed at a later fabrication stage. In some embodiments, line features 212, 214, 216, 218 are functional features, such as semiconductor fins or metal lines.

The line features 212, 214, 216, 218 may be formed to have a same or different width(s). In some embodiments, the line features 212, 214, 216, 218 are formed corresponding to, for example, active regions in a static random access memory (SRAM) cell. Accordingly, the outer line features, i.e., line features 212 and 218, are formed to be wider than the inner line features, i.e., line features 214 and 216, and the spacing between two inner line features, i.e., line features 214, 216, is smaller than the spacing between an inner line feature, i.e., line feature 214 or 216, and a corresponding adjacent outer line feature, i.e., line feature 212 or 218. In some embodiments, each of the outer line features 212, 218 has a width of 15.5 nm, and each of the inner line features 214, 216 has a width of 8 nm. In some embodiments, the spacing between the inner line features 214, 216 is about 32 nm, and the spacing between the inner line feature 216 and the outer line feature 218 is about 39 nm.

As integrated circuit features continue to shrink in size, the pitches and critical dimensions of line features 212, 214, 216, 218 also shrink. In some embodiments, the pitch of adjacent inner line features, i.e., line features 214 and 216, is between 20 nm and 40 nm. As used here, the term "pitch" is the distance between identical points in two neighboring features. In some instances, pitch can be viewed as the distance from a center of one feature to a center of another neighboring feature.

The patterning-target layer 204 may be patterned by any suitable method. In some embodiments, the patterning-target layer 204 is patterned using a single lithography process. In some embodiments, a first photoresist layer (not shown) is applied over the patterning-target layer 204. In some embodiments, the first photoresist layer includes chemicals that are sensitive to light, such as UV light. In some embodiments, the first photoresist layer includes one or more organic polymer materials. In some embodiments, the deposition of the first photoresist layer includes a spin coating process and may be followed by a baking process. In some embodiments, the first photoresist layer is formed to have a thickness in a range from about 30 nm to about 100 nm, although lesser or greater thicknesses can also be employed.

The first photoresist layer is subsequently patterned using a lithography process. In some embodiments, patterning the first photoresist layer includes exposing the first photoresist layer to a radiation, post-exposure baking, developing the first photoresist layer in a resist developer, and hard baking thereby removing exposed portions in the case of positive resist (or unexposed portions in the case of negative resist) of the first photoresist layer, leaving unexposed portions thereof on the patterning-target layer 204 as the resist pattern. The resist pattern corresponds to the main pattern 210 to be formed in the patterning-target layer 204. In some embodiments, the lithography process may alternatively employ other suitable technology, such as electron-beam direct writing.

The patterned first photoresist layer is then used as an etching mask to transfer the pattern in the first photoresist layer to the patterning-target layer 204. In some embodiments, the regions of the patterning-target layer 204 that are not covered by the patterned first photoresist layer are removed using one or more anisotropic etching processes, leaving the regions corresponding to the main pattern 210 remain in the patterning-target layer 204. In some embodiments, the one or more anisotropic etching processes include a dry etch process, such as a plasma etching process or a reactive ion etching (RIE) process, a wet etching process, or a combination thereof. In some embodiments, the anisotropic etching process includes using etching gases including at least one of carbon tetrafluoride ($CF_4$), difluoromethane ($CH_2F_2$), trifluoromethane ($CHF_3$), other suitable etching gases, or combinations thereof.

After forming the main pattern 210 in the patterning-target layer 204, the patterned first photoresist layer is removed. In some embodiments, the patterned first photoresist layer is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof.

In some embodiments, the patterning-target layer 204 is patterned using two or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over the patterning-target layer 204 and patterned using a photolithography process. Spacers are formed alongside the patterned sacrificial layer using a self-aligned process. The sacrificial layer is then removed, and the remaining spacers may then be used to pattern the patterning-target layer 204 to form the main pattern 210.

Figure 4B:
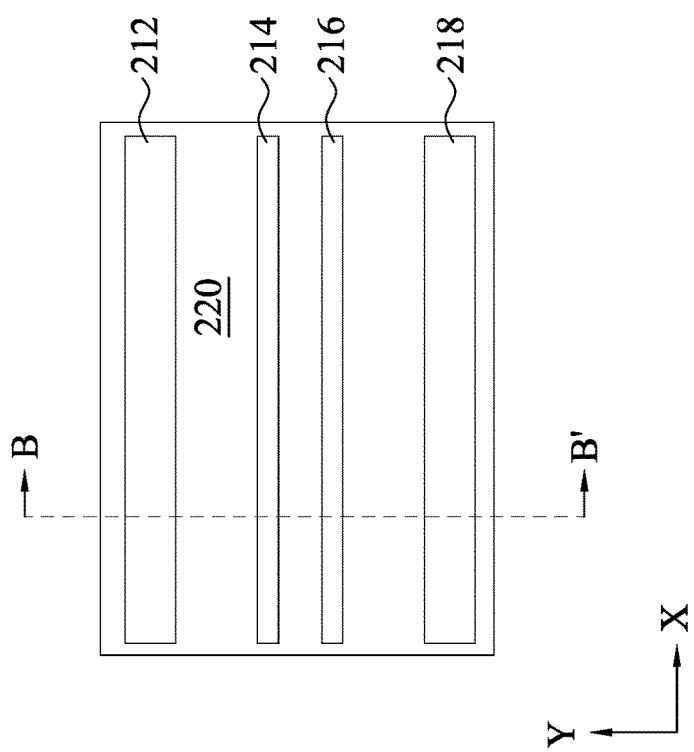
Figure 4A:
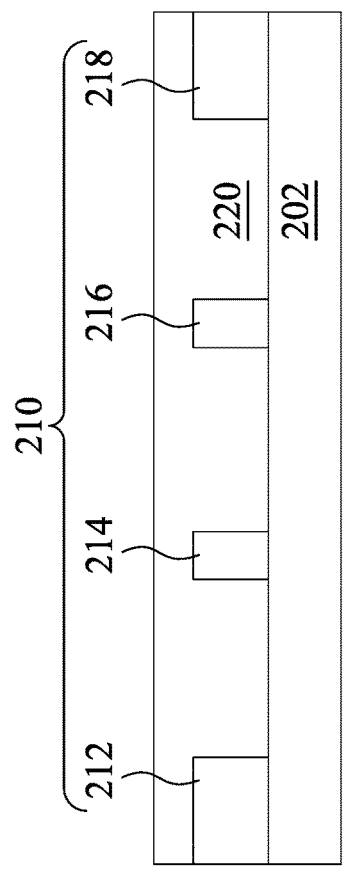

Referring to FIGS. 1 and 4A-4B, the method 100 proceeds to operation 106, in which a second photoresist layer 220 is deposited over the substrate 202 to cover the main pattern 210. FIG. 4A is a top view of the semiconductor structure of FIGS. 3A and 3B after depositing the second photoresist layer 220 over the substrate 202 to cover the main pattern 210, in accordance with some embodiments. FIG. 4B is a cross-sectional view of the semiconductor structure of FIG. 4A taken along line B-B'.

Referring to FIGS. 4A and 4B, the second photoresist layer 220 is formed over the main pattern 210 and the substrate 202. In some embodiments, the second photoresist layer 220 includes chemicals that are sensitive to light, such as UV light. In some embodiments, the second photoresist layer 220 includes one or more organic polymer materials. In some embodiments, the second photoresist layer 220 includes materials that are substantially similar to the materials of the first photoresist layer. In some embodiments, the deposition of the second photoresist layer 220 includes a spin-on coating process and may be followed by a baking process. In some embodiments, the second photoresist layer 220 is formed to completely fill the spaces between the line features 212, 214, 216, 218 of the main pattern 210. Accordingly, a top surface of the second photoresist layer 220 is located above top surfaces of the line features 212, 214, 216, 218. In some embodiments, the second photoresist layer 220 has a thickness in a range from about 10 nm to about 100 nm, although lesser or greater thicknesses can also be employed.

Figure 5B:
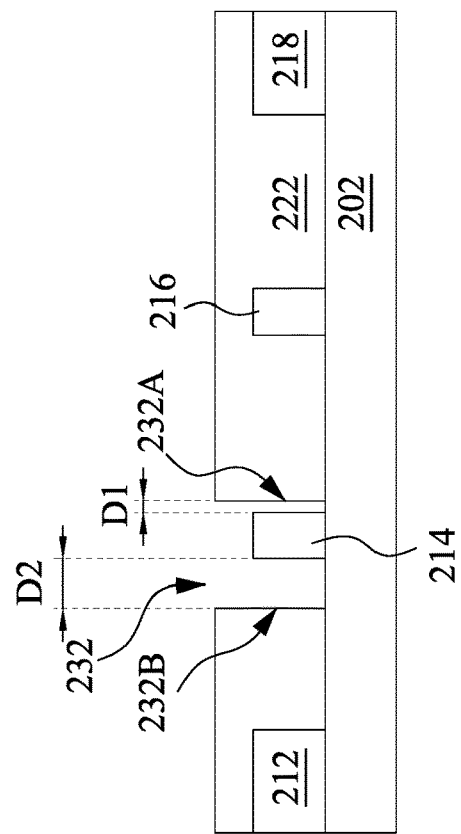
Figure 5A:
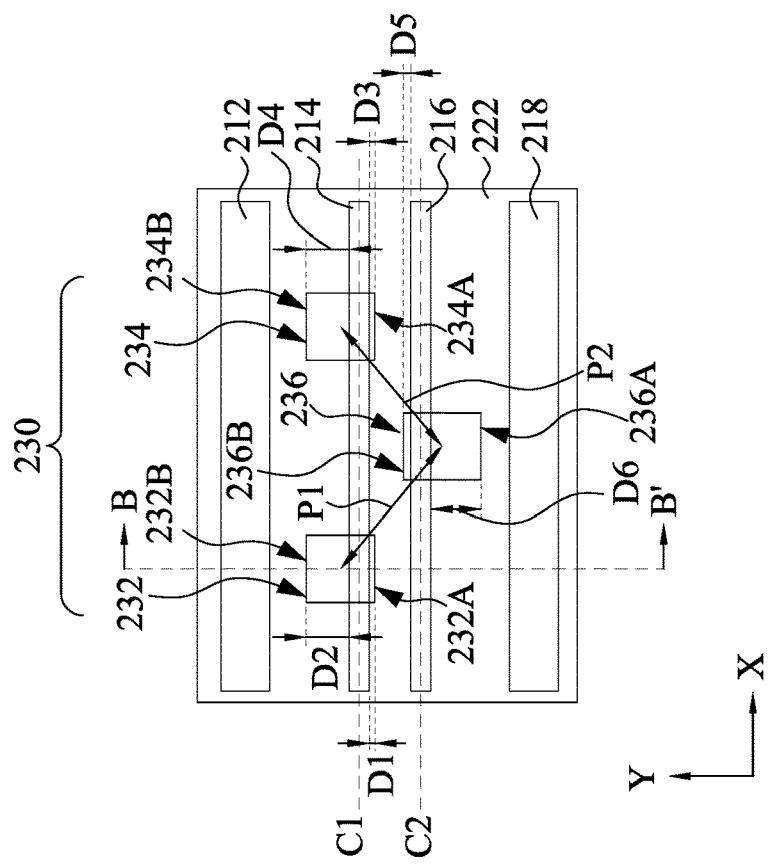

Referring to FIGS. 1 and 5A-5B, the method 100 proceeds to operation 108, in which the second photoresist layer 220 is patterned to form a patterned second photoresist layer 222 comprising a cut pattern 230. FIG. 5A is a top view of the semiconductor structure of FIGS. 4A and 4B after patterning the second photoresist layer 220 to form the patterned second photoresist layer 222 comprising the cut pattern 230, in accordance with some embodiments. FIG. 5B is a cross-sectional view of the semiconductor structure of FIG. 5A taken along line B-B'.

Referring to FIGS. 5A and 5B, the cut pattern 230 includes a plurality of cut features, e.g., cut features 232, 234, 236, overlying the main pattern 210. The cut features 232, 234, 236 are intended to remove unnecessary portions of the line features 212, 214, 216, 218 so that the circuit associated with the resulting target pattern will function properly. In some embodiments, the cut features 232, 234, 236 are formed to expose portions of inner line features, i.e., line features 214, 216, to be removed in the following operations according to design specification. In some embodiments, the cut features 232, 234, 236 are trenches extending through the second photoresist layer 220. In some embodiments, the cut pattern 230 includes a first cut feature 232 that exposes a first portion of the line feature 214, a second cut feature 234 that is adjacent to the first cut feature 232 and exposes a second portion of the line feature 214, and a third cut feature 236 expositing a portion of the line feature 216. Although three cut features 232, 234, 236 are shown and described in FIG. 5A, any numbers of cut features are contemplated in the present disclosure. As shown in FIG. 5A, the first cut feature 232 includes opposite sidewalls 232A, 232B with sidewall 232A extending into the space between the closely spaced line features 214 and 216 and sidewall 232B extending into the space between the widely spaced line features 212 and 214. The second cut feature 234 includes opposite sidewalls 234A, 234B with sidewall 234A extending into the space between the closely spaced line features 214 and 216 and sidewall 234B extending into the space between the widely spaced line features 212 and 214. The third cut feature 236 includes opposite sidewalls 236A, 236B with sidewall 236A extending into the space between the closely spaced line features 214 and 216 and sidewall 236B extending into the space between the widely spaced line features 216 and 218.

In some embodiments, a single, direct lithography process is performed to pattern the second photoresist layer 220 to form the cut features 232, 234, 236. In some embodiments, the lithography process includes exposing the second photoresist layer 220 to a light source using a photomask, performing post-exposure bake processes, and developing the second photoresist layer 220 to form the cut features 232, 234, 236 in the second photoresist layer 220. The cut features 232, 234, 236 may be formed in any shape such as a square, rectangular, round, or oval shape. In some embodiments and as in FIG. 5B, the cut features 232, 234, 236 are formed with substantially vertical sidewalls. In some other embodiments, the cut features 232, 234, 236 are formed with inclined sidewalls (not shown). In some embodiments, the cut features 232, 234, 236 are formed to have a same size. In some embodiments, the cut features 232, 234, 236 are formed to have different sizes.

As with all features in integrated circuits, the cut features 232, 234, 236 have to conform to design rules and other constraints. In order to be formed with a single exposure of a single photomask at a given technology node, thus eliminating the need of using multiple photomasks or the expensive EUV lithography technique, the pitch between each adjacent pair of cut features 232, 234, 236 has to be greater than the minimum pitch that can be obtained with a single lithography process at the given technology node. For example, the first pitch P1 between the first cut feature 232 and the third cut feature 236 and the second pitch P2 between the second cut feature 234 and the third cut feature 236 all need to be greater than the minimum pitch of the single lithography process. To provide an adequate lithography window, the cut features 232, 234, 236 are formed in a relaxed-pitch arrangement with a comparatively large pitch. This can be done by moving at least one cut feature 232, 234 and/or 236 in the cut pattern 230 away from along the Y direction so as to increase the distances between the adjacent cut features 232, 234, 236. The pitch P1 and/or P2 between adjacent cut features 232, 234, 236 can thus be increased, allowing forming the cut features 232, 234, 236 by a single lithography process using a single photomask. In some embodiments and as shown in FIG. 5A, the cut features 232, 234 are moved toward the outer line feature 212 along the positive Y direction, while the cut feature 236 is moved toward the outer line feature 218 along the negative Y direction. As a result, the pitch P1 between the cut features 232 and 236 and the pitch P2 between the cut features 234 and 236 are relaxed.

As a result of the pitch relaxation, the cut features 232, 234, 236 are asymmetrically arranged with respect to respective central axes of the line features 214, 216. For example, the first cut feature 232 is asymmetrically arranged with respect to a central axis C1 of the line feature 214 extending along the X direction such that the sidewall 232A of the first cut feature 232 is positioned closer to the line feature 214 than the opposite sidewall 232B. Accordingly, the spacing D1 between the sidewall 232A of the first cut feature 232 and the line feature 214 is smaller than the spacing D2 between the opposite sidewall 232B of the first cut feature 232 and the line feature 214. Similarly, the second cut feature 234 is asymmetrically arranged with respect to the central axis C1 of the line feature 214 such that the sidewall 234A of the second cut feature 234 is positioned closer to the line feature 214 than the opposite sidewall 234B. Accordingly, the spacing D3 between the sidewall 234A of the second cut feature 234 and the line feature 214 is smaller than the spacing D4 between the opposite sidewall 234B of the second cut feature 234 and the line feature 214. The third cut feature 236 is asymmetrically arranged with respect to a central axis C2 of the line feature 216 extending along the X direction such that the sidewall 236B of the third cut feature 236 is positioned closer to the line feature 216 than the opposite sidewall 236A. Accordingly, the spacing D5 between the sidewall 236B of the third cut feature 236 and the line feature 216 is smaller than the spacing D6 between the opposite sidewall 236A of the third cut feature 236 and the line feature 216.

Although in embodiments illustrated in FIGS. 5A and 5B, both cut features in a pair of adjacent cut features 232 and 236 or 234 and 236 are moved along the positive or negative Y direction to relax the pitch P1 or P2, it is contemplated that the pitch P1 or P2 may be relaxed by moving only one cut feature in the adjacent cut feature pair, e.g., cut features 232 and 236 or cut features 234 and 236 to provide the desired distance between the adjacent cut features, cut features 232 and 236 or cut features 234 and 236.

In some embodiments, the narrow spacing between one sidewall 232A, 234A, 236A of each of cut features 232, 234, 236 and a corresponding line feature 214, 216, however, does not provide adequate cut budget for the subsequently etching process. The cut features 232, 234, 236 have to be enlarged to ensure there is enough cut budget for subsequent etching process.

Figure 6B:
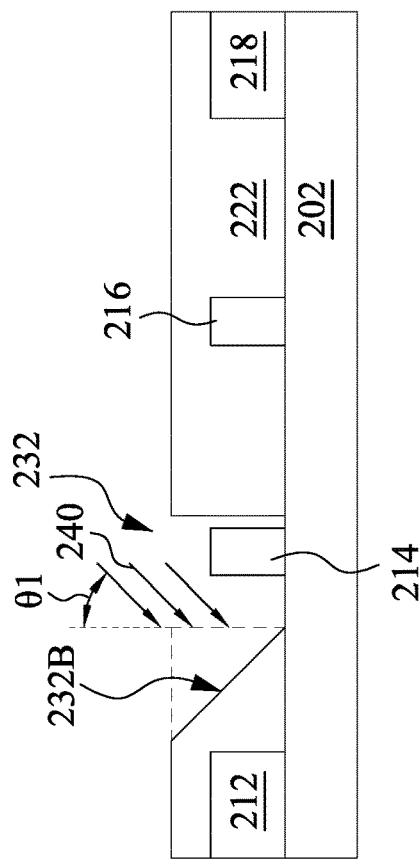
Figure 6A:
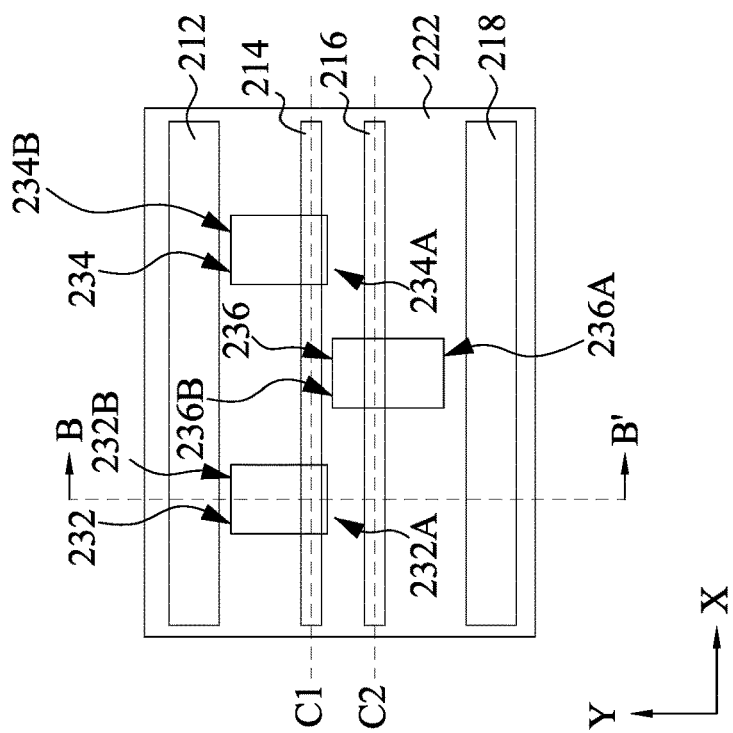

Referring to FIGS. 1 and 6A-6B, the method 100 proceeds to operation 110, in which a first angled ion implantation process is performed to implant ions 240 to sidewalls 232B, 234B, 236B of respective cut features 232, 234, 236. FIG. 6A is a top view of the semiconductor structure of FIGS. 5A and 5B after performing the first angled ion implantation process to implant the ions 240 to the sidewalls 232B, 234B, 236B of respective cut features 232, 234, 236, in accordance with some embodiments. FIG. 6B is a cross-sectional view of the semiconductor structure of FIG. 6A taken along line B-B'.

Referring to FIGS. 6A and 6B, the ions 240 having a first implantation direction is directed toward the sidewalls 232B, 234B, 236B of respective cut features 232, 234, 236. The incident angle θ1 of the ions 240, which is defined as an angle between the ions 240 and a normal line perpendicular to the top surface of the substrate 202, is chosen such that the sidewalls 232B, 234B, 236B on the first side of the cut features 232, 234, 236 are exposed to the ions 240, whereas the sidewalls 232A, 234A, 236A on the second side of the cut features 232, 234, 236 are substantially not exposed to the ions 240. In such a manner, the ion implantation process does not require any additional masking steps, and thus does not incur any additional manufacturing cost. In some embodiments, the incident angle θ1 can be achieved by placing the substrate 202 on a stage and tilting the stage so as to tilt the substrate 202. In some embodiments, the stage can be tilted at an angle between about 5 and about 60 degrees. During the first angled ion implantation, the ions 240 strike the sidewalls 232B, 234B, 236B of respective cut features 232, 234, 236 to sputter the photoresist away from the sidewalls 232B, 234B, 236B of respective cut features 232, 234, 236, causing the localized removal of photoresist from the sidewalls 232B, 234B, 236B of respective cut features 232, 234, 236. After the first angled ion implantation, the sidewalls 232B, 234B, 236B of respective cut features 232, 234, 236 may be substantially vertical or sloped or have an hourglass profile.

As a result of the localized photoresist removal from the sidewalls 232B, 234B, 236B of respective cut features 232, 234, 236, the cut features 232, 234, 236 are enlarged in the positive Y direction such that sidewalls 232B, 234B, 236B of the cut features 232, 234, 236 are positioned away from the corresponding line features 214, 216. The narrow spacing between the sidewall 236B of the cut feature 236 and the line feature 216 is thus increased, which allows for easy removal of the unwanted portion of the line feature 216.

Exemplary ions 240 that can be employed in the present disclosure include inert gas ions, such as helium, neon, argon, krypton, xenon, and radon ions. In some embodiments, argon ions are used. The ion energy and dose of the ions 240 are adjusted to control the extent of end-push of the cut features 232, 234, 236. The ion energy may be about several hundred eV or greater. In some embodiments, the ions 240 are implanted at an energy from about 0.5 keV to about 20 keV and at a dosage from about $1.0\times10^{14}$ ions/cm$^2$ to $8.0\times10^{18}$ ions/cm$^2$, although lesser and greater ion energies and doses can be employed.

The incident angle, energy and/or dosage of the ions 240 may be controlled to control the amount of the photoresist being removed from the sidewalls 232B, 234B, 236B of respective cut features 232, 234, 236.

Figure 7B:
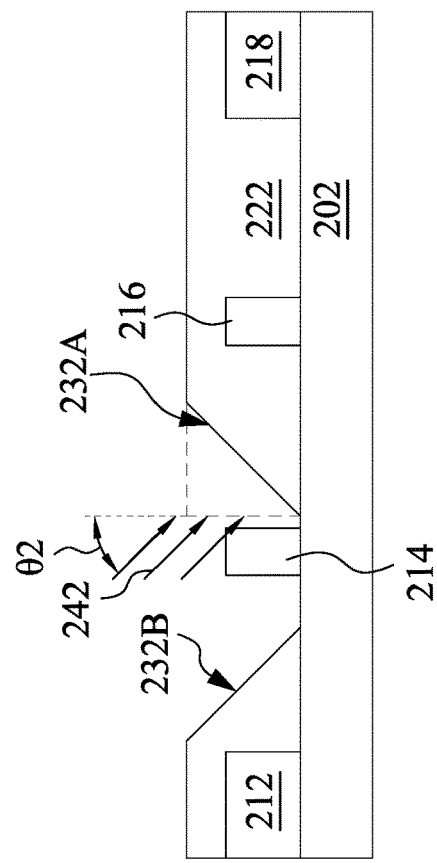
Figure 7A:
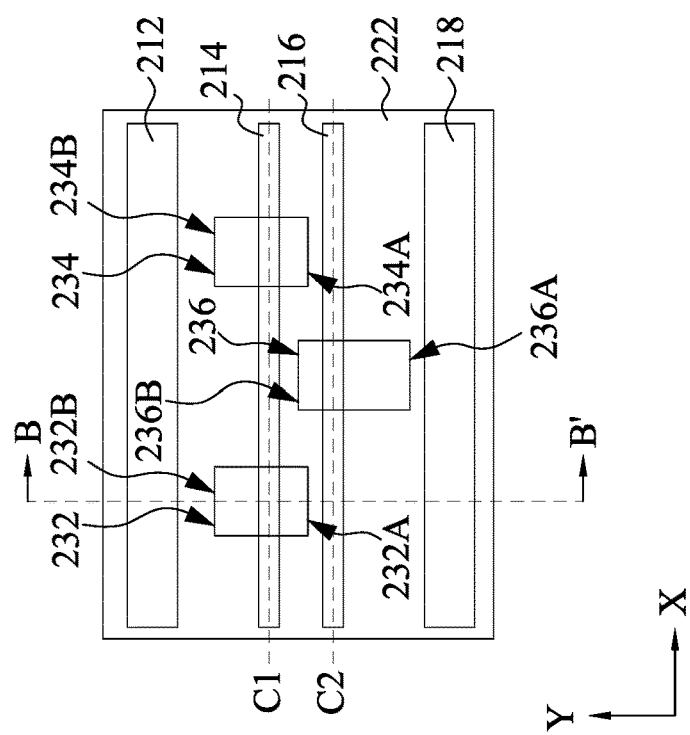

Referring to FIGS. 1 and 7A-7B, the method 100 proceeds to operation 112, in which a second angled ion implantation process is performed to implant ions 242 to sidewalls 232A, 234A, 236A of respective cut features 232, 234, 236. FIG. 7A is a top view of the semiconductor structure of FIGS. 6A and 6B after performing the second angled ion implantation process to implant the ions 242 to the sidewalls 232A, 234A, 236A of respective cut features 232, 234, 236, in accordance with some embodiments. FIG. 7B is a cross-sectional view of the semiconductor structure of FIG. 7A taken along line B-B'.

Referring to FIGS. 7A and 7B, the ions 242 having a second implantation direction is directed toward the sidewalls 232A, 234A, 236A of respective cut features 232, 234, 236. The incident angle θ2 of the ions 242, which is defined as an angle between the ions 242 and a normal line perpendicular to the top surface of the substrate 202, is chosen such that the sidewalls 232A, 234A, 236A on the second side of the cut features 232, 234, 236 are exposed to the ions 242, whereas the sidewalls 232B, 234B, 236B on the first side of the cut features 232, 234, 236 are substantially not exposed to the ions 242. In such a manner, the second ion implantation process advantageously does not require any additional masking steps, and thus does not incur any additional manufacturing cost. In some embodiments, the incident angle θ2 can be achieved by placing the substrate 202 on a stage and tilting the stage so as to tilt the substrate 202. In some embodiments, the stage can be tilted at an angle between about 5 and about 60 degrees. During the second angled ion implantation, the ions 242 strike the sidewalls 232A, 234A, 236A of respective cut features 232, 234, 236 to sputter the photoresist away from the sidewalls 232A, 234A, 236A of respective cut features 232, 234, 236, thereby causing the localized removal of photoresist from the sidewalls 232A, 234A, 236A of respective cut features 232, 234, 236. After the second angled ion implantation, the sidewalls 232A, 234A, 236A of respective cut features 232, 234, 236 may be substantially vertical or sloped or have an hourglass profile.

As a result of the photoresist removal from the sidewalls 232A, 234A, 236A of respective cut features 232, 234, 236, the cut features 232, 234, 236 are enlarged in the negative Y direction such that sidewalls 232A, 234A, 236A of the cut features 232, 234, 236 are positioned away from the corresponding line features 214, 216. Each narrow spacing between the sidewalls 232A, 234A of respective cut features 232, 234 and the line feature 214 is thus increased, which allows for easy removal of the unwanted portions of the line feature 214.

Exemplary ions 242 that can be employed in the present disclosure include inert gas ions, such as helium, neon, argon, krypton, xenon, and radon ions. In some embodiments, argon ions are used. The ion energy may be about several hundred eV or greater. In some embodiments, the ions 242 are implanted at an energy from about 0.5 keV to about 20 keV and at a dosage from about $1.0\times10^{14}$ ions/cm$^2$ to $8.0\times10^{18}$ ions/cm$^2$, although lesser and greater ion energies and doses can be employed.

The incident angle, energy and/or dosage of the ions 242 may be controlled to control the amount of the photoresist being removed from the sidewalls 232A, 234A, 236A of respective cut features 232, 234, 236. In some embodiments, the condition of the second ion implantation (e.g., incident angle, energy and/or dosage of ions 242) may be selected to allow more photoresist to be removed by the second angled ion implantation than the first angled ion implantation. In some embodiments, the condition of the second ion implantation (e.g., incident angle, energy and/or dosage of ions 242) may be selected to allow less photoresist to be removed by the second angled ion implantation than the first angled ion implantation.

By directional end pushing using the angled implantation processes to enlarge the size of the cut features 232, 234, 236, the cut margin reduced by the pitch relaxation operation is recovered. In some embodiments, the total amount of the end-to-end pushing (i.e., size increase) after the first and second angled implantations can be from about 3 nm to about 8 nm. As a result, the cut process window for the subsequent etching process is improved.

In some embodiments, the as formed cut features 232, 234, 236 may have an oval shape, which may cause the non-uniform cut in the subsequent cut process. It has been shown that the angled ion implantation processes also help to improve the pattern profile of the cut features 232, 234, 236, and after the ion implantation processes, the profile of the cut features 232, 234, 236 is closer to a rectangular shape which helps to improve the uniformity of the subsequent etching.

Figure 9:
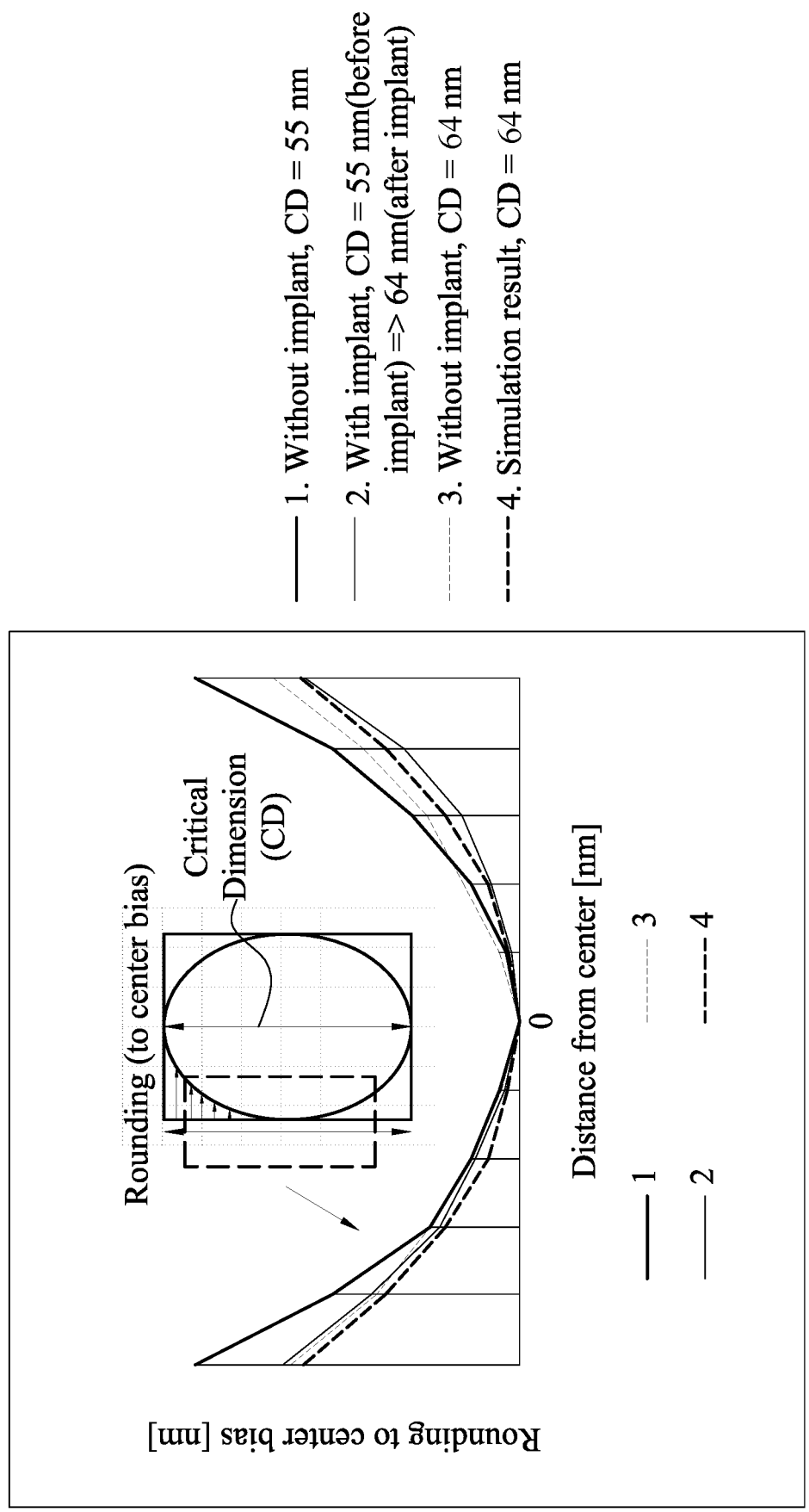
FIG. 9 illustrates effects of ion implantation on the pattern profile for exemplary cut features.

The effects of the angled ion implantation processes on the pattern profiles of exemplary cut features are illustrated in FIG. 9. Curve 1 represents a pattern profile of an oval-shaped cut feature having a critical dimension (CD) of 55 nm without ion implantation treatment. Curve 2 represents a pattern profile of an as formed oval-shaped cut feature having a CD of 55 nm after ion implantation treatment. Curve 3 represents a pattern profile for an oval-shaped cut feature having a CD of 64 nm without ion implantation. Curve 4 shows the simulation results of a rectangular shaped cut pattern having a CD of 64 nm. It can be seen from FIG. 9 that the ion implantation process not only enlarges the CD of the cut feature, it also results in a cut feature with a pattern profile closer to a rectangular shape, which is desirable for achieving uniform etching.

Referring to FIGS. 1 and 8A-8B, the method 100 proceeds to operation 114, in which portions of the line features 214, 216 that are exposed by the cut features 232, 234, 236 are removed. FIG. 8A is a top view of the semiconductor structure of FIGS. 7A and 7B after removing the portions of the line features 214, 216 that are exposed by the cut features 232, 234, 236, in accordance with some embodiments. FIG. 8B is a cross-sectional view of the semiconductor structure of FIG. 8A taken along line B-B'.

Referring to FIGS. 8A and 8B, the portions of the line features 214, 216 that are exposed by the cut features 232, 234, 236 are removed using one or more etching processes. In some embodiments, the one or more etching processes include a dry etching process such as a plasma etching process or RIE, a wet etching process, or a combination thereof, so that the corresponding portions of the line features 214, 216 can be selectively etched without impacting the substrate 202. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof. In some embodiments, the etching process can use solutions such as tetramethylammonium hydroxide (TMAH), hydrofluoric acid (HF), a $HF/HNO_3/CH_3COOH$ solution, $NH_4OH$, potassium hydroxide (KOH), or other suitable solutions.

The line feature 214 is, thus, cut by the cut features 232, 234, forming segmented line features 214A, 214B, 214C spaced apart from each other. Likewise, the line feature 216 is cut by the cut feature 236, forming segmented line features 216A, 216B spaced apart from each other. The resulting the segmented line features 214A-214C, 216A, 216B and the line features 212, 218 together constitute a target pattern 250.

After etching, the second photoresist layer 222 is subsequently removed. In some embodiments, the patterned second photoresist layer 222 is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof.

In some embodiments, the segmented line features 214A-214C, 216A, 216B, and the line features 212, 218 represent a plurality of fins for formation of FinFETs. In some embodiments, the segmented line features 214A-214C, 216A, 216B, and the line features 212, 218 are dummy features and are used as an etch mask to pattern the substrate 202, thereby forming a plurality of fins in an upper portion of the substrate 202 for formation of FinFETs.

Related CMOS processing can be employed in various embodiments to continue processing operations and form suitable p-type and n-type FinFET devices that utilize the fins. For example, a first gate structure can be formed over portions of a first set of fins and first source/drain regions comprising dopants of an n-type conductivity can be formed on opposite sides of the first gate structure to provide n-type FinFETs. A second gate structure can be formed over portions of a second set of fins and second source/drain regions comprising dopants of a p-type conductivity can be formed on opposite sides of the second gate structure to provide p-type FinFETs. The gate structures can be formed utilizing a gate first or a gate last process known in the art. Each gate structure may include a gate dielectric and a gate conductor.

FIGS. 10A-11C are various views of intermediate stages in the formation of the semiconductor structure 200, in accordance with first alternative embodiments. Unless specified otherwise, the materials and the formation processes of the components in the first alternative embodiments are essentially the same as their like components, which are denoted by like reference numerals in the embodiments shown in FIGS. 2A-8B. The details regarding the formation processes and the materials of the components shown in FIGS. 10A-11C are thus found in the discussion of the embodiments shown in FIGS. 2A-8B.

The initial steps of the first alternative embodiments are substantially similar to those in FIGS. 2A-4B. Operation 102 is performed in which a patterning-target layer 204 is formed over a substrate 202 (FIGS. 2A and 2B). Next, operation 104 is performed in which the patterning-target layer 204 is patterned to form a main pattern 210 including line features 212, 214, 216, 218 (FIGS. 3A and 3B). Next, operation 106 is performed in which a second photoresist layer 220 is deposited over the main pattern 210 (FIGS. 4A and 4B). Next, operation 108 is performed in which the second photoresist layer 220 is patterned to form a patterned second photoresist layer 222 comprising a cut pattern 230.

Figure 10B:
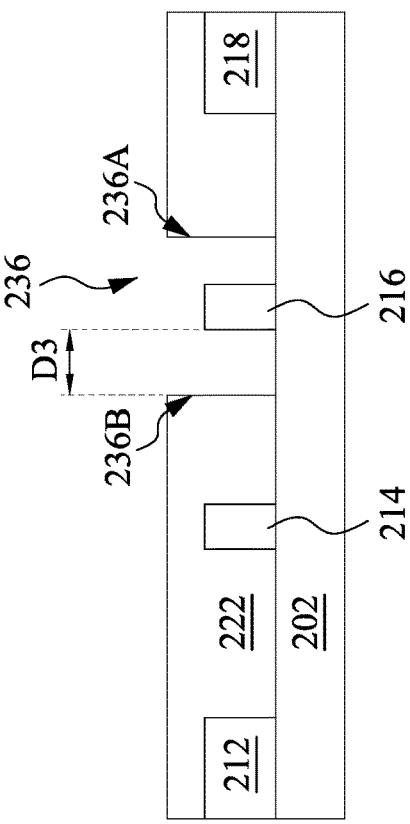
FIGS. 10A-11C are various views of the semiconductor structure at various fabrication stages constructed according to the method of FIG. 1, in accordance with first alternative embodiments.
Figure 10C:
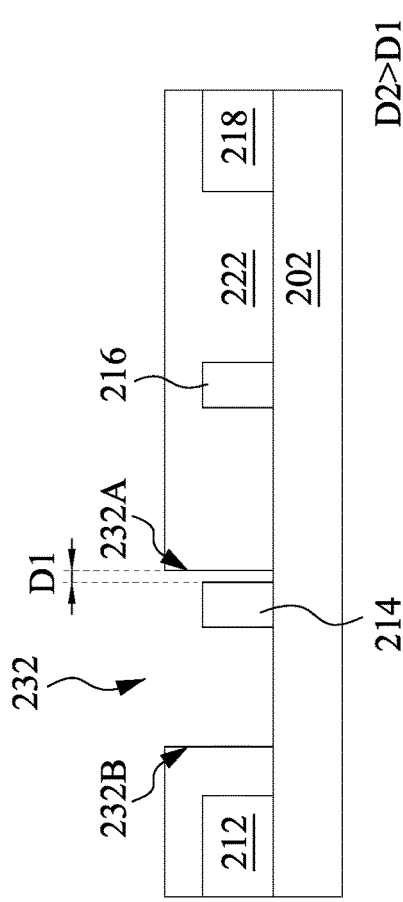
Figure 10A:
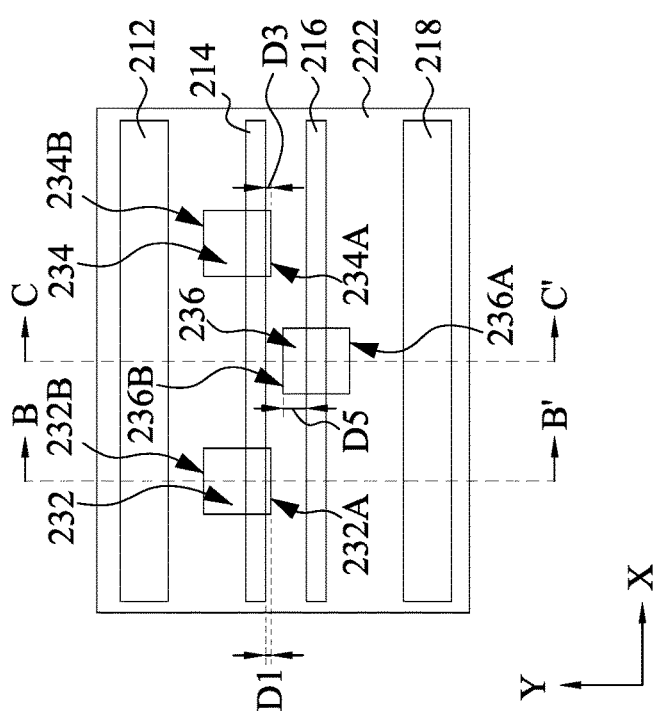

FIGS. 10A-10C illustrate various views of the semiconductor structure after operation 108. FIG. 10A is a top view of the semiconductor structure of FIGS. 4A and 4B after patterning the second photoresist layer 220 to form the patterned second photoresist layer 222 comprising the cut pattern 230, in accordance with some embodiments. FIG. 10B is a cross-sectional view of the semiconductor structure of FIG. 10A taken along line B-B'. FIG. 10C is a cross-sectional view of the semiconductor structure of FIG. 10A taken along line C-C'.

Referring to FIGS. 10A-10C, the cut pattern 230 includes a plurality of cut features, e.g., cut features 232, 234, 236, overlying the main pattern 210. Unlike the embodiments shown in FIGS. 5A and 5B, where all three cut features 232, 234, 236 need to be moved away toward the respective outer line features 212, 218 so as to relax the pitch P1 between the cut features 232 and 236 and the pitch P2 between the cut features 234 and 236, in the first alternative embodiments as shown in FIGS. 10A-10C, only the first and second cut features 232, 234 overlying the line feature 214 need to be moved away in the positive Y direction toward the outer line feature 212 in order to provide a sufficient pitch between each cut feature pair, i.e., cut features 232 and 236, or cut features 234 and 236, which allows for using a single photomask in formation of these cut features 232, 234, 236. Accordingly, the distance D1 between the sidewall 232A of the first cut feature 232 and the line feature 214, and the distance D3 between the sidewall 234A of the second cut feature 234 and the line feature 214 remain small, which does not provide enough cut budget for the subsequent etching process. In contrast, the distance D5 between the sidewall 236B of the third cut feature 236 and the line feature 216, which is greater than the distance D1 or D3, is sufficiently large to provide enough cut budget for the subsequent etching process. Accordingly, only a single ion implantation process is required to push the end of each of cut feature 232, 234 in the negative Y direction so that the sidewalls 232A, 234A of respective cut features 232, 234 can be further away from the line feature 214. No ion implantation process is needed to push the end of the cut feature in the positive Y direction because the sidewall 236B of the cut feature 236 is sufficiently away from the line feature 216 Operation 110 is thus omitted.

Figure 11B:
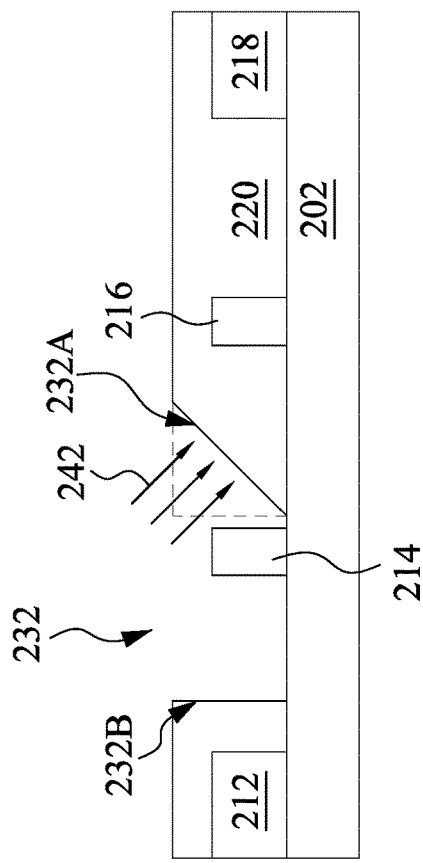
Figure 11C:
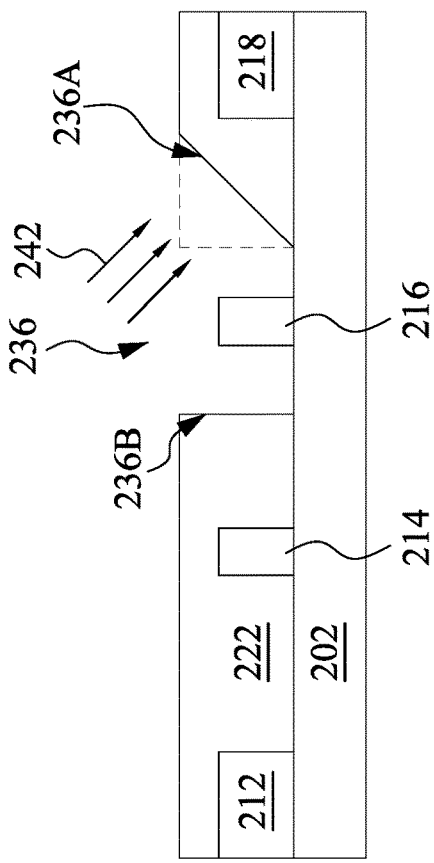
Figure 11A:
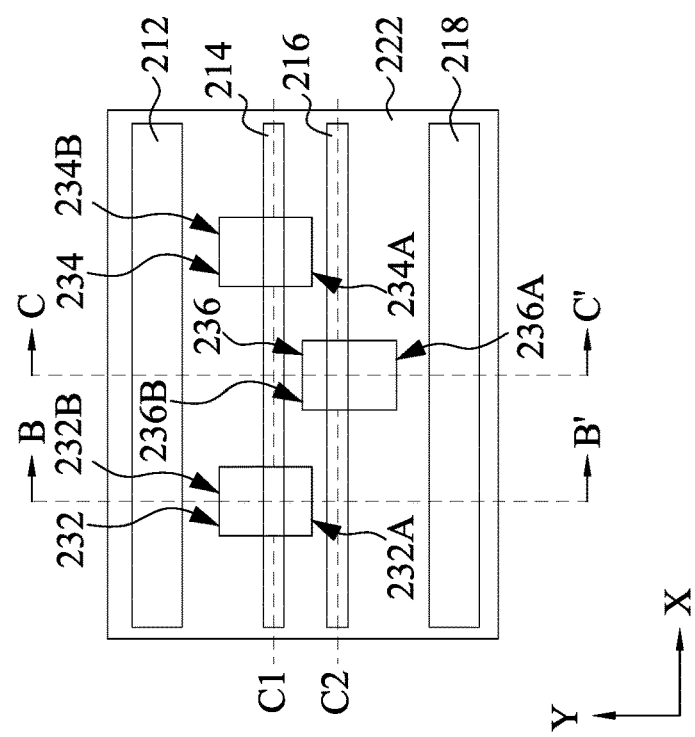

Next, operation 112 is performed in which an angled ion implantation process is performed to implant ions 242 to sidewalls 232A, 234A, 236A of respective cut features 232, 234, 236. FIG. 11A is a top view of the semiconductor structure of FIGS. 10A-10C after performing the angled ion implantation process to implant the ions 242 to the sidewalls 232A, 234A, 236A of respective cut features 232, 234, 236, in accordance with some embodiments. FIG. 11B is a cross-sectional view of the semiconductor structure of FIG. 11A taken along line B-B'. FIG. 11C is a cross-sectional view of the semiconductor structure of FIG. 11A taken along line C-C'.

Referring to FIGS. 11A-11C, the ions 242 are directed toward the sidewalls 232A, 234A, 236A of respective cut features 232, 234, 236. The incident angle of the ions 242, which is defined as an angle between the ions 242 and a normal line perpendicular to the top surface of the substrate 202, is chosen such that the sidewalls 232A, 234A, 236A on the second side of the cut features 232, 234, 236 are exposed to the ions 242, whereas the sidewalls 232B, 234B, 236B on the first side of the cut features 232, 234, 236 are substantially not exposed to the ions 242. In such a manner, the ion implantation process advantageously does not require any additional masking steps, and thus does not incur any additional manufacturing cost. During the angled ion implantation, the ions 242 strike the sidewalls 232A, 234A, 236A of respective cut features 232, 234, 236 to sputter the photoresist away from the sidewalls 232A, 234A, 236A of respective cut features 232, 234, 236, thereby causing the localized removal of photoresist from the sidewalls 232A, 234A, 236A of respective cut features 232, 234, 236.

As a result of the photoresist removal from the sidewalls 232A, 234A, 236A of respective cut features 232, 234, 236, the cut features 232, 234, 236 are enlarged in the negative Y direction such that sidewalls 232A, 234A, 236A of the cut features 232, 234, 236 are positioned away from the corresponding line features 214, 216. Each narrow spacing between the sidewalls 232A, 234A of respective cut features 232, 234 and the line feature 214 is thus increased, which allows for easy removal of the unwanted portions of the line feature 214.

By directional end pushing using the angled implantation process to enlarge the size of the cut features 232, 234, the cut margin reduced by the pitch relaxation operation is recovered. As a result, the cut process window for the subsequent etching process is improved.

Next, operation 114 is performed, in which portions of the line features 214, 216 that are exposed by the cut features 232, 234, 236 are removed to provide the semiconductor structure 200 (FIGS. 8A and 8B).

Related CMOS processing can be employed in various embodiments to continue processing operations and form suitable p-type and n-type FinFET devices that utilize the fins. For example, a first gate structure can be formed over portions of a first set of fins and first source/drain regions comprising dopants of an n-type conductivity can be formed on opposite sides of the first gate structure to provide n-type FinFETs. A second gate structure can be formed over portions of a second set of fins and second source/drain regions comprising dopants of a p-type conductivity can be formed on opposite sides of the second gate structure to provide p-type FinFETs. The gate structures can be formed utilizing a gate first or a gate last process known in the art. Each gate structure may include a gate dielectric and a gate conductor.

FIGS. 12A-14C are various views of intermediate stages in the formation of the semiconductor structure 200, in accordance with second alternative embodiments. Unless specified otherwise, the materials and the formation processes of the components in the second alternative embodiments are essentially the same as their like components, which are denoted by like reference numerals in the embodiments shown in FIGS. 2A-8B. The details regarding the formation processes and the materials of the components shown in FIGS. 12A-14C are thus found in the discussion of the embodiments shown in FIGS. 2A-8B.

The initial steps of the second alternative embodiments are substantially similar to those in FIGS. 2A-4B. Operation 102 is performed in which a patterning-target layer 204 is formed over a substrate 202 (FIGS. 2A and 2B). Next, operation 104 is performed in which the patterning-target layer 204 is patterned to form a main pattern 210 including line features 212, 214, 216, 218 (FIGS. 3A and 3B). Next, operation 106 is performed in which a second photoresist layer 220 is deposited over the main pattern 210 (FIGS. 4A and 4B). Next, operation 108 is performed in which the second photoresist layer 220 is patterned to form a patterned second photoresist layer 222 comprising a cut pattern 230.

Figure 12B:
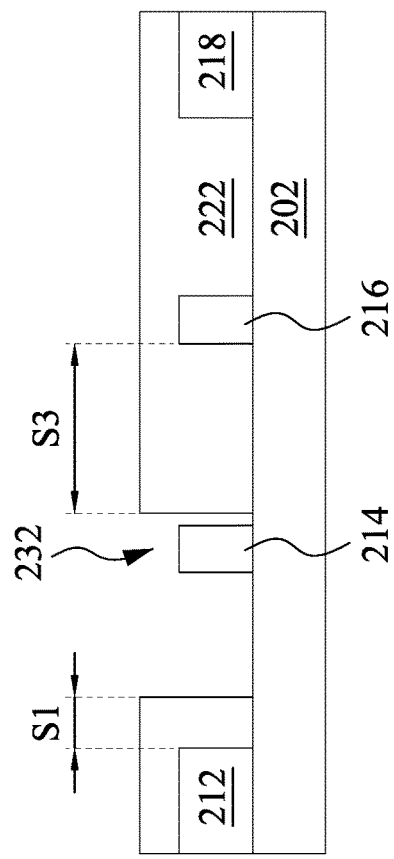
FIGS. 12A-14C are various views of the semiconductor structure at various fabrication stages constructed according to the method of FIG. 1, in accordance with second alternative embodiments.
Figure 12C:
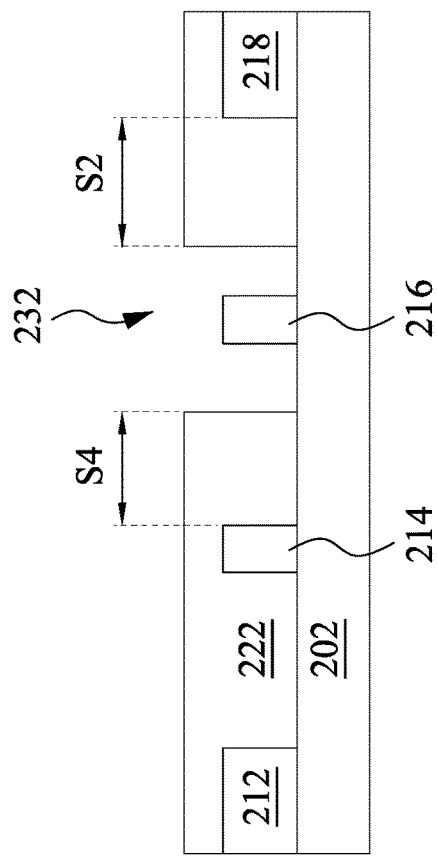
Figure 12A:
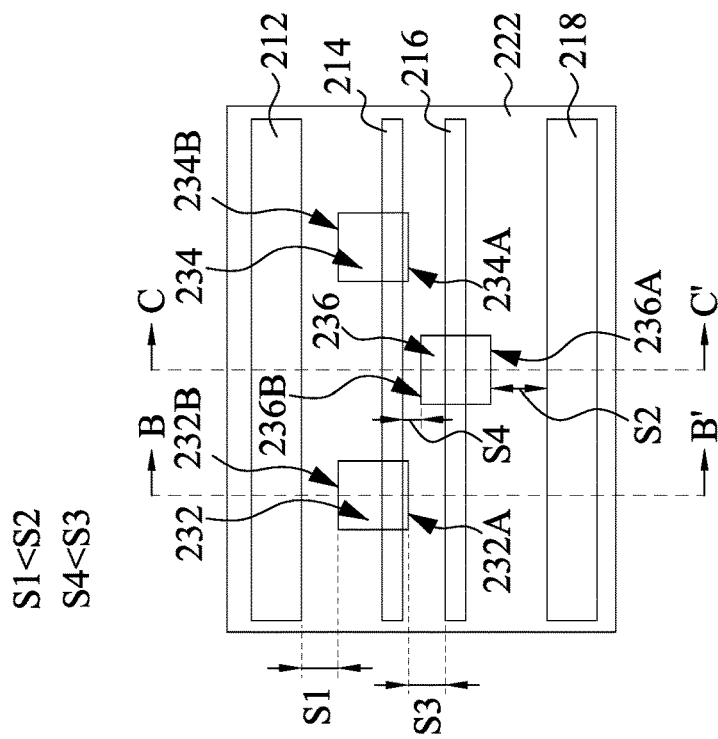

FIGS. 12A-12C illustrate various views of the semiconductor structure after operation 108. FIG. 12A is a top view of the semiconductor structure of FIGS. 4A and 4B after patterning the second photoresist layer 220 to form the patterned second photoresist layer 222 comprising the cut pattern 230, in accordance with some embodiments. FIG. 12B is a cross-sectional view of the semiconductor structure of FIG. 12A taken along line B-B'. FIG. 12C is a cross-sectional view of the semiconductor structure of FIG. 12A taken along line C-C'.

Referring to FIGS. 12A-12C, the cut pattern 230 includes a plurality of cut features, e.g., cut features 232, 234, 236, overlying the main pattern 210. The cut features 232, 234, 236 are positioned to relax the pitch requirements such that they can be fabricated using a single photomask. For example, as shown in FIG. 12A, the cut features 232, 234, 236 are positioned such that the distance S1 between the sidewall 232B of the first cut feature 232 and the adjacent line feature 212 is less than the distance S2 between the sidewall 236A of the third cut feature 236 and the adjacent line feature 218, while the distance S3 between the sidewall 232A of the first cut feature 232 and the line feature 216 is greater than the distance S4 between the sidewall 236B and the line feature 214. Accordingly, such cut feature arrangement causes the space in the positive Y direction less than the space in the negative Y direction, and thus asymmetric implantation can be used to enlarge the sizes of respective cut features 232, 234, 236.

Figure 13B:
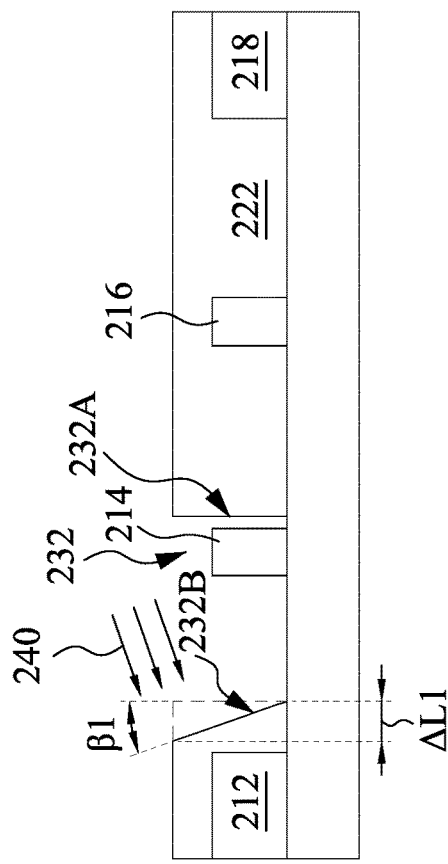
Figure 13C:
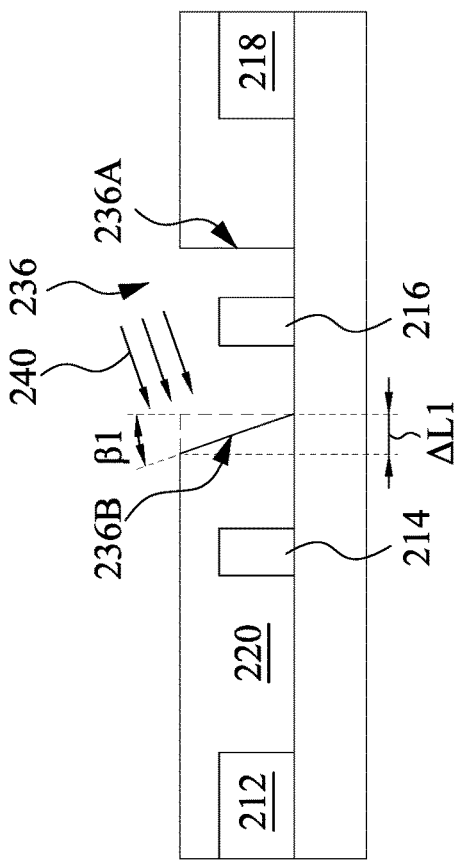
Figure 13A:
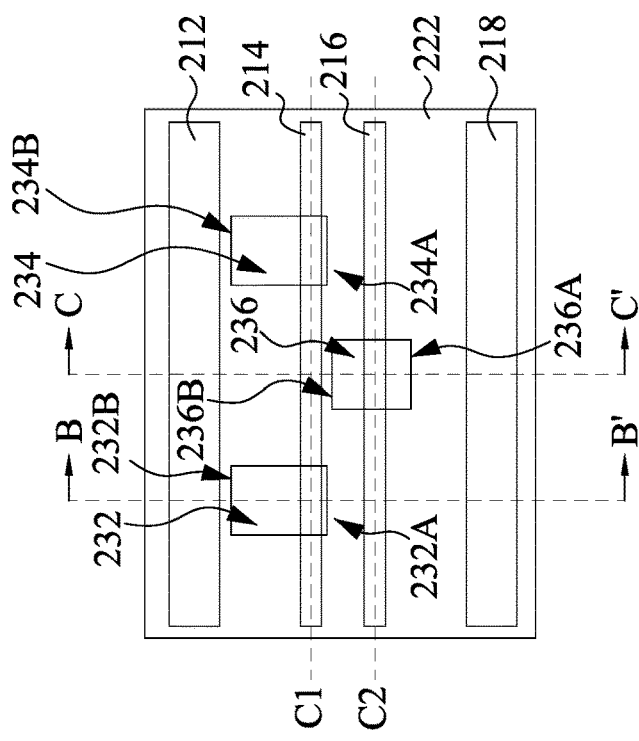

Next, operation 110 is performed, in which a first angled ion implantation process is performed to implant ions 240 to sidewalls 232B, 234B, 236B of respective cut features 232, 234, 236 (FIGS. 13A-13C). FIG. 13A is a top view of the semiconductor structure of FIGS. 12A-12C after performing the first angled ion implantation process to implant the ions 240 to the sidewalls 232B, 234B, 236B of respective cut features 232, 234, 236, in accordance with some embodiments. FIG. 13B is a cross-sectional view of the semiconductor structure of FIG. 13A taken along line B-B'. FIG. 13C is a cross-sectional view of the semiconductor structure of FIG. 13A taken along line C-C'.

Referring to FIGS. 13A-13C, the ions 240 having a first implantation direction are directed toward the sidewalls 232B, 234B, 236B of respective cut features 232, 234, 236. The incident angle of the ions 240, which is defined as an angle between the ions 240 and a normal line perpendicular to the top surface of the substrate 202, is chosen such that the sidewalls 232B, 234B, 236B on the first side of the cut features 232, 234, 236 are exposed to the ions 240, whereas the sidewalls 232A, 234A, 236A on the second side of the cut features 232, 234, 236 are substantially not exposed to the ions 240. During the first angled ion implantation, the ions 240 strike the sidewalls 232B, 234B, 236B of respective cut features 232, 234, 236. to sputter the photoresist away from the sidewalls 232B, 234B, 236B of respective cut features 232, 234, 236, thereby causing the localized removal of photoresist from the sidewalls 232B, 234B, 236B of respective cut features 232, 234, 236.

Because the spacing between the sidewall 232A of the first cut feature 232 and the underlying line feature 216 is greater than the spacing between the sidewall 236B of the third cut feature 236 and the line feature 214, i.e., S3>S4, less photoresist needs to be removed from the sidewall 236B of the third cut feature 236 to provide enough cut budget for removal of the unwanted portion of the line feature 216. Accordingly, the energy and/or dosage of the ions 240 are controlled such that a relatively small portion of the photoresist is removed from each of the sidewalls 232B, 234B, 236B of respective cut features 232, 234, 236. In some embodiments, each removed photoresist portion has a triangular cross-sectional shape with a base length ΔL1. After the first angled ion implantation, each sidewall 232B, 234B, 236B of the cut features 232, 234, 236 is inclined at a first angle (31 with respect to the normal line that is perpendicular to the top surface of the substrate 202.

As a result of the photoresist removal from the sidewalls 232B, 234B, 236B of respective cut features 232, 234, 236, the cut features 232, 234, 236 are enlarged in the positive Y direction such that sidewalls 232B, 234B, 236B of the cut features 232, 234, 236 are positioned away from the corresponding line features 214, 216. The spacing between the sidewall 236B of the cut feature 236 and the line feature 216 is thus increased, which allows for easy removal of the unwanted portion of the line feature 216.

Figure 14B:
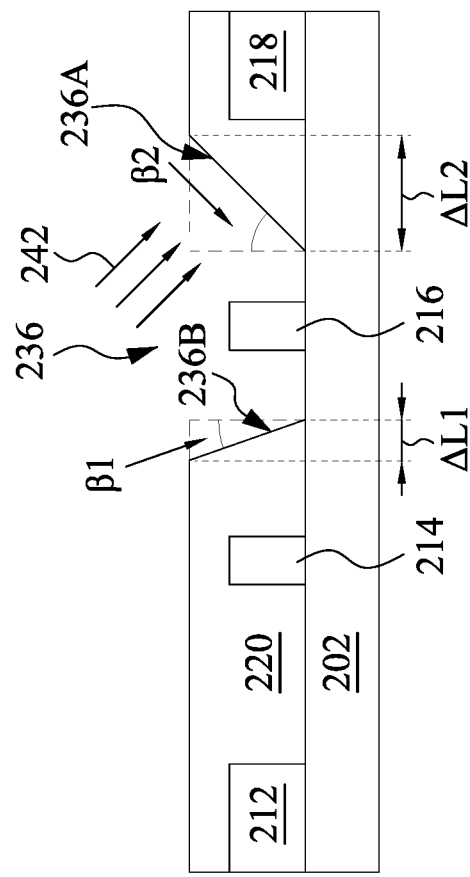
Figure 14C:
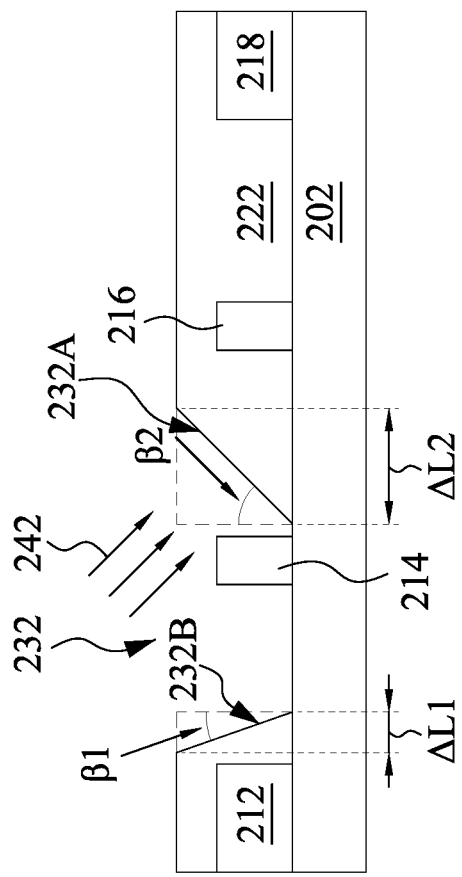
Figure 14A:
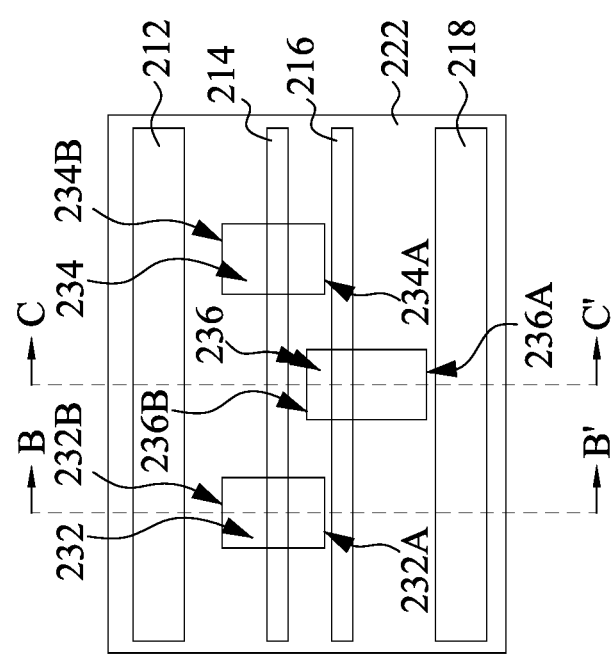

Next, operation 112 is performed, in which a second angled ion implantation process is performed to implant ions 242 to sidewalls 232A, 234A, 236A of respective cut features 232, 234, 236 (FIGS. 14A-14C). FIG. 14A is a top view of the semiconductor structure of FIGS. 13A-13C after performing the second angled ion implantation process to implant the ions 242 to the sidewalls 232A, 234A, 236A of respective cut features 232, 234, 236, in accordance with some embodiments. FIG. 14B is a cross-sectional view of the semiconductor structure of FIG. 14A taken along line B-B'. FIG. 14C is a cross-sectional view of the semiconductor structure of FIG. 14A taken along line C-C'.

Referring to FIGS. 14A-14C, the ions 242 having a second implantation direction is directed toward the sidewalls 232A, 234A, 236A of respective cut features 232, 234, 236. The incident angle of the ions 242, which is defined as an angle between the ions 242 and a normal line perpendicular to the top surface of the substrate 202, is chosen such that the sidewalls 232A, 234A, 236A on the second side of the cut features 232, 234, 236 are exposed to the ions 242, whereas the sidewalls 232B, 234B, 236B on the first side of the cut features 232, 234, 236 are substantially not exposed to the ions 242. During the second angled ion implantation, the ions 242 strike the sidewalls 232A, 234A, 236A of respective cut features 232, 234, 236 to sputter the photoresist away from the sidewalls 232A, 234A, 236A of respective cut features 232, 234, 236, thereby causing the localized removal of photoresist from the sidewalls 232A, 234A, 236A of respective cut features 232, 234, 236.

In the second alternative embodiments, because the distance S3 between the sidewall 232A of the first cut feature 232 and the adjacent line feature 216 is greater than the distance S4 between the sidewall 236B of the third cut feature 236 and the adjacent line feature 214, i.e., S3>S4, more photoresist can be removed from the sidewall 232A of the first cut feature 232 to provide enough cut budget for removal of the unwanted portion of the line feature 214 underlying the first cut feature 232. Accordingly, the energy and/or dosage of the ions 242 are controlled to be higher than the energy and/or dose of the ions 240. A relatively large amount of the photoresist thus is removed from each of the sidewalls 232A, 234A, 236A of respective cut features 232, 234, 236 compared with the amount of the photoresist that is removed from each of the sidewalls 232B, 234B, 236B of respective cut features 232, 234, 236. In some embodiments, each removed photoresist portion has a triangular cross-sectional shape with a base length ΔL2, which is greater than AU. After the second angled ion implantation, each sidewall 232A, 234A, 236A of the cut features 232, 234, 236 are inclined at a second angle β2 with respect to the normal line that is perpendicular to the top surface of the substrate 202. The second incline angle β2 is greater than the first incline angle β1.

As a result of the photoresist removal from the sidewalls 232A, 234A, 236A of respective cut features 232, 234, 236, the cut features 232, 234, 236 are enlarged in the negative Y direction such that sidewalls 232A, 234A, 236A of the cut features 232, 234, 236 are positioned away from the corresponding line features 214, 216. Each narrow spacing between the sidewalls 232A, 234A of respective cut features 232, 234 and the line feature 214 is thus increased, which allows for easy removal of the unwanted portions of the line feature 214.

Next, operation 114 is performed, in which portions of the line features 214, 216 that are exposed by the cut features 232, 234, 236 are removed to provide the semiconductor structure 200 (FIGS. 8A and 8B).

Related CMOS processing can be employed in various embodiments to continue processing operations and form suitable p-type and n-type FinFET devices that utilize the fins. For example, a first gate structure can be formed over portions of a first set of fins and first source/drain regions comprising dopants of an n-type conductivity can be formed on opposite sides of the first gate structure to provide n-type FinFETs. A second gate structure can be formed over portions of a second set of fins and second source/drain regions comprising dopants of a p-type conductivity can be formed on opposite sides of the second gate structure to provide p-type FinFETs. The gate structures can be formed utilizing a gate first or a gate last process known in the art. Each gate structure may include a gate dielectric and a gate conductor.

One aspect of this description relates to a method for forming a semiconductor structure. The method includes forming a pattern comprising a first line feature and a second line feature extending in a first direction on a substrate, depositing a photoresist layer on the substrate to cover the pattern, patterning the photoresist layer to form a cut pattern comprising a first cut feature exposing a portion of the first line feature and a second cut feature exposing a portion of the second line feature. In a top view, at least one of the first cut feature and the second cut feature is asymmetrically arranged with respect to a central axis of a corresponding first or second line feature. The method further includes performing at least one angled ion implantation to enlarge the first cut feature and the second cut feature in at least one direction perpendicular to the first direction, removing the portion of the first line feature exposed by the first cut feature and the portion of the second line feature exposed by the second cut feature, and removing the photoresist layer.

Another aspect of this description relates to a method for forming a semiconductor structure. The method includes forming a pattern on a substrate. The pattern includes a first line feature and a second line feature extending in a first direction; and the method further includes depositing a photoresist layer on the substrate to cover the pattern. The method further includes patterning the photoresist layer to form a first cut feature exposing a portion of the first line feature and a second cut feature exposing a portion of the second line feature. In a top view, the first cut feature is asymmetrically arranged with respect to a central axis of the first line feature. The method further includes performing a first angled ion implantation to enlarge the first cut feature and the second cut feature in a second direction perpendicular to the first direction, removing the portion of the first line feature exposed by the first cut feature and the portion of the second line feature exposed by the second cut feature, and removing the photoresist layer.

Still another aspect of this description relates to a method for forming a semiconductor structure. The method includes etching a patterning-target layer to form a pattern on a substrate. The pattern includes a first line feature and a second line feature extending in a first direction; and the method further includes depositing a photoresist layer on the substrate to cover the pattern. The method further includes patterning the photoresist layer to form a first cut feature exposing a portion of the first line feature and a second cut feature exposing a portion of the second line feature. Each of the first cut feature and the second cut features has first and second sidewalls extending in the first direction. A first spacing between the first sidewall of the first cut feature and the first line feature is greater than a second spacing between the second sidewall of the first cut feature and the first line feature. A first spacing between the first sidewall of the second cut feature and the second line feature is less than a second spacing between the second sidewall of the second cut feature and the second line feature. The second sidewall of the first cut feature is proximate to the second line feature, and the first sidewall of the second cut feature is proximate to the first line feature; and the method further includes performing a first angled ion implantation to enlarge the first cut feature and the second cut feature in a second direction perpendicular to the first direction. The method further includes performing a second angled ion implantation to enlarge the first cut feature and the second cut feature in a third direction opposite the second direction, removing the portion of the first line feature exposed by the first cut feature and the portion of the second line feature exposed by the second cut feature, and removing the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a pattern comprising a first line feature and a second line feature extending in a first direction on a substrate;
    depositing a photoresist layer on the substrate to cover the pattern;
    patterning the photoresist layer to form a cut pattern comprising a first cut feature exposing a portion of the first line feature and a second cut feature exposing a portion of the second line feature, wherein in a top view, at least one of the first cut feature and the second cut feature is asymmetrically arranged with respect to a central axis of a corresponding first or second line feature;
    performing at least one angled ion implantation to enlarge the first cut feature and the second cut feature in at least one direction perpendicular to the first direction;
    removing the portion of the first line feature exposed by the first cut feature and the portion of the second line feature exposed by the second cut feature; and
    removing the photoresist layer.

2. The method of claim 1, wherein performing the at least one angled ion implantation comprises performing a first angled ion implantation to enlarge the first cut feature and the second cut feature in a second direction perpendicular to the first direction.

3. The method of claim 2, wherein performing the first angled ion implantation comprises striking a first sidewall of each of the first cut feature and the second cut feature with first ions to increase a spacing between the first sidewall of the first cut feature and the first line feature and a spacing between the first sidewall of the second cut feature and the second line feature.

4. The method of claim 3, wherein performing at least one angled ion implantation further comprises performing a second angled ion implantation to enlarge the first cut feature and the second cut feature in a third direction opposite the second direction.

5. The method of claim 4, wherein performing the second angled ion implantation comprises striking a second sidewall of each of the first cut feature and the second cut feature with second ions to increase a spacing between the second sidewall of the first cut feature and the first line feature and a spacing between the second sidewall of the second cut feature and the second line feature.

6. The method of claim 1, wherein the first cut feature and the second cut feature have a pitch that is equal to or greater than a minimum pitch of a single lithography at a given technology node.

7. A method for forming a semiconductor structure, comprising:
    forming a pattern on a substrate, wherein the pattern comprises a first line feature and a second line feature extending in a first direction;
    depositing a photoresist layer on the substrate to cover the pattern;
    patterning the photoresist layer to form a first cut feature exposing a portion of the first line feature and a second cut feature exposing a portion of the second line feature, wherein in a top view, the first cut feature is asymmetrically arranged with respect to a central axis of the first line feature;
    performing a first angled ion implantation to enlarge the first cut feature and the second cut feature in a second direction perpendicular to the first direction;
    removing the portion of the first line feature exposed by the first cut feature and the portion of the second line feature exposed by the second cut feature; and
    removing the photoresist layer.

8. The method of claim 7, wherein the patterning the photoresist layer is performed using a single photomask.

9. The method of claim 7, wherein each of the first cut feature and the second cut feature has opposite first and second sidewalls extending in the first direction.

10. The method of claim 9, wherein a first spacing between the first sidewall of the first cut feature and the first line feature is greater than a second spacing between the second sidewall of the first cut feature and the first line feature, the second sidewall is proximate to the second line feature, wherein the first angled ion implantation enlarges the second spacing between the second sidewall of the first cut feature and the first line feature.

11. The method of claim 9, wherein performing the first angled ion implantation comprises implanting first ions to the second sidewall of each of the first cut feature and the second cut feature to remove portions of the photoresist layer.

12. The method of claim 9, wherein in a top view, the second cut feature is asymmetrically arranged with respect to a central axis of the second line feature, wherein a first spacing between the first sidewall of the second cut feature and the second line feature is less than a second spacing between the second sidewall of the second cut feature and the second line feature, the first sidewall is proximate to the first line feature.

13. The method of claim 12, further comprising performing a second angled ion implantation to enlarge the first cut feature and the second cut feature in a third direction opposite the second direction.

14. The method of claim 13, wherein the second angled ion implantation enlarges the first spacing between the first sidewall of the second cut feature and the second line feature.

15. The method of claim 13, wherein performing the second angled ion implantation comprises implanting second ions to the first sidewall of each of the first cut feature and the second cut feature to remove other portions of the photoresist layer.

16. A method for forming a semiconductor structure, comprising:
  etching a patterning-target layer to form a pattern on a substrate, wherein the pattern comprises a first line feature and a second line feature extending in a first direction;
  depositing a photoresist layer on the substrate to cover the pattern;
  patterning the photoresist layer to form a first cut feature exposing a portion of the first line feature and a second cut feature exposing a portion of the second line feature, wherein each of the first cut feature and the second cut features has first and second sidewalls extending in the first direction, a first spacing between the first sidewall of the first cut feature and the first line feature is greater than a second spacing between the second sidewall of the first cut feature and the first line feature, a first spacing between the first sidewall of the second cut feature and the second line feature is less than a second spacing between the second sidewall of the second cut feature and the second line feature, the second sidewall of the first cut feature is proximate to the second line feature, and the first sidewall of the second cut feature is proximate to the first line feature;
  performing a first angled ion implantation to enlarge the first cut feature and the second cut feature in a second direction perpendicular to the first direction;
  performing a second angled ion implantation to enlarge the first cut feature and the second cut feature in a third direction opposite the second direction;
  removing the portion of the first line feature exposed by the first cut feature and the portion of the second line feature exposed by the second cut feature; and
  removing the photoresist layer.

17. The method of claim 16, wherein performing the first angled ion implantation comprises striking the second sidewalls of the respective first cut feature and second cut feature with first ions having a first implantation direction.

18. The method of claim 17, wherein performing the second angled ion implantation comprises striking the first sidewalls of the respective first cut feature and second cut feature with second ions having a second implantation direction different from the first implantation direction.

19. The method of claim 18, wherein the first ions have a first implant dose, and the second ions have a second implant dose different from the first implant dose.

20. The method of claim 18, wherein the first ions have a first implant energy, and the second ions have a second implant energy different from the first implant energy.

* * * * *